United States Patent
Bonen (10) Patent No.: US 12,431,605 B2
(45) Date of Patent: *Sep. 30, 2025

(54) FREQUENCY SELECTIVE RF DIRECTIONAL COUPLER

(71) Applicant: Harmonic, Inc., San Jose, CA (US)

(72) Inventor: Adi Bonen, North York (CA)

(73) Assignee: Harmonic, Inc., San Jose, CA (US)

( * ) Notice: Subject to any disclaimer, the term of this patent is extended or adjusted under 35 U.S.C. 154(b) by 628 days.

This patent is subject to a terminal disclaimer.

(21) Appl. No.: 17/668,376

(22) Filed: Feb. 9, 2022

(65) Prior Publication Data

US 2022/0271408 A1 Aug. 25, 2022

Related U.S. Application Data (63) Continuation of application No. 16/897,224, filed on Jun. 9, 2020, now Pat. No. 11,276,913.

(60) Provisional application No. 62/862,302, filed on Jun. 17, 2019.

(51) Int. Cl.
- H01P 5/18 (2006.01)
- H03H 9/64 (2006.01)
- H04L 5/14 (2006.01)

(52) U.S. Cl.
CPC ............ *H01P 5/18* (2013.01); *H03H 9/64* (2013.01); *H04L 5/143* (2013.01)

(58) Field of Classification Search
CPC ..................................... H01P 5/18; H03H 9/64
See application file for complete search history.

(56) References Cited

U.S. PATENT DOCUMENTS

| | | | |
|---|---|---|---|
| 6,801,086 B1* | 10/2004 | Chandrasekaran ... | H03F 1/3247 375/296 |
| 6,882,221 B2* | 4/2005 | Schreyer ............... | H03F 1/3247 330/149 |
| 7,218,186 B2* | 5/2007 | Chen ...................... | H01P 5/185 333/116 |
| 9,178,264 B2* | 11/2015 | Kuwajima ............... | H01P 5/18 |
| 9,866,244 B2* | 1/2018 | Srirattana ............ | H04B 1/0057 |
| 9,954,564 B2* | 4/2018 | Little ..................... | H04B 1/401 |
| 10,566,674 B2* | 2/2020 | Ishihara ................. | H03H 7/485 |
| 10,778,175 B2* | 9/2020 | Lim ........................ | H03F 3/213 |

(Continued)

*Primary Examiner* — Andrea Lindgren Baltzell
*Assistant Examiner* — Alan Wong
(74) *Attorney, Agent, or Firm* — Brokaw Patent Law, PC; Christopher J. Brokaw (57) ABSTRACT

A directional coupler having coupling variability at separate portions of an operational frequency band. The coupler may be comprised within a Full Duplex (FDX) amplifier and itself may comprise input and output ports, a coupled port, a termination port, a first RF filter coupled to the coupled port, and a second RF filter coupled to the termination port. The first and second RF filters yield a first coupling value at one portion of the operational frequency band of the coupler and a second coupling value at a second portion of the operational frequency band. The first portion of the band corresponds to a range of frequencies at which higher coupling for the coupler is desired and greater loss in the signal is tolerable. The second portion of the band corresponds to a range of frequencies at which lower coupling for the coupler is tolerable and lower signal loss is desirable.

13 Claims, 6 Drawing Sheets

(56) References Cited

U.S. PATENT DOCUMENTS 11,276,913 B1 * 3/2022 Bonen ..................... H01P 5/18
2021/0013858 A1 * 1/2021 Tokuda ................... H01P 5/18

* cited by examiner

FREQUENCY SELECTIVE RF DIRECTIONAL COUPLER

CLAIM OF PRIORITY

This application is a continuation of, and claims priority to, U.S. Non-Provisional patent application Ser. No. 16/897,224, filed Jun. 9, 2020, entitled "Frequency Selective RF Directional Coupler," the contents of which are hereby incorporated by reference for all purposes as if fully set forth herein.

U.S. Non-Provisional patent application Ser. No. 16/897,224 claims priority to U.S. Provisional Patent Application Ser. No. 62/862,302, filed Jun. 17, 2019, entitled "Frequency Selective RF Directional Coupler," the contents of which are hereby incorporated by reference for all purposes as if fully set forth herein.

FIELD OF THE INVENTION

Embodiments of the invention relate to a directional coupler having coupling variability at separate portions of an operational frequency band.

BACKGROUND

Figure 1:
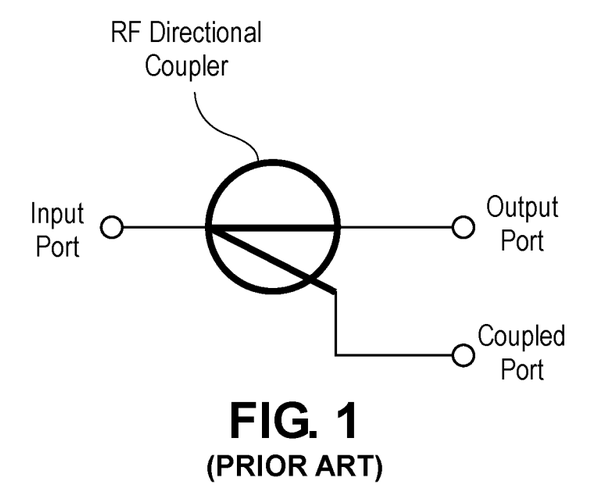
FIG. 1 is a symbolic illustration of a theoretical RF directional coupler as known in the prior art.

FIG. 1 is a symbolic illustration of a theoretical RF directional coupler as known in the prior art. As can be appreciated by viewing FIG. 1, a theoretical RF directional coupler has 3 ports, namely an input port, an output port, and a coupled port. The function of a RF directional coupler is to direct most of the RF signal power applied to the input port to the output port, except for a defined portion of the RF signal power which is diverted to the coupled port.

In typical applications, a uniform transfer function (i.e., amplitude and phase over frequency) is desired between the input and output ports as well as between the input and coupled ports. A theoretical RF directional coupler functions such a signal applied to the output port will be transferred by the theoretical RF directional coupler to the input port, but not to the coupled port. Thus, while a theoretical RF directional coupler is input-output symmetrical in the sense that it transfers signals in a very similar way from the input port to the output port as well as from the output port to the input port, a theoretical RF directional coupler exhibits selective directionality in regards to the coupled port. The coupled port is said to exhibit directionality because a portion of the signal power applied to the input port of a theoretical RF directional coupler is directed to the coupled port, but none of the signal power applied to the output port of a theoretical RF directional coupler is directed to the coupled port.

Figure 2:
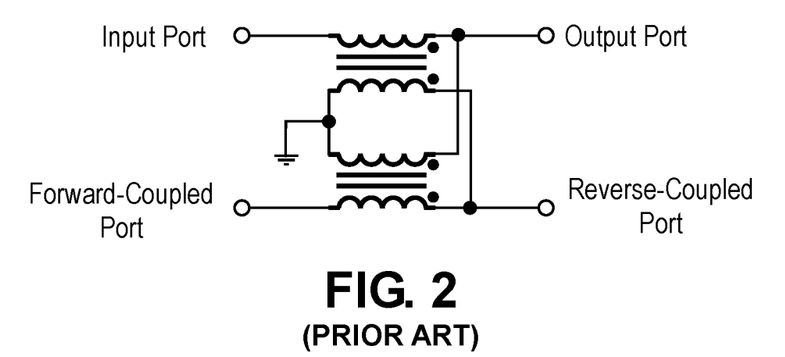
FIG. 2 is an illustration of an example internal construction of a practical RF directional coupler constructed using two transformers as known in the prior art.

In the real-world, practical RF directional couplers are typically implemented as a device with four ports. FIG. 2 is an illustration of an example internal construction of a practical RF directional coupler constructed using two transformers as is known in the art. As shown in FIG. 2, a practical RF directional coupler having four ports comprises an input port, an output port, a forward-coupled port, and a reverse-coupled port. A practical RF directional coupler is designed to exhibit directivity in a symmetrical way: the forward-coupled port receives a portion of the signal power applied to the input port but not a portion of the signal power applied to the output port; similarly, the reverse-coupled port receives a portion of the signal power applied to the output port but not a portion of the signal power applied to the input port.

Practical RF directional couplers are not perfect, and a small portion of an undesired signal power still arrives at the coupled ports. In other words, while not desired or intended, in practice the forward-coupled port receives a small portion of the signal power applied to the output port. An attribute of a practical directional coupler called directivity is the ratio between the coupling in the desired direction and the coupling in the undesired direction, which is typically expressed in decibels (dB).

Figure 3:
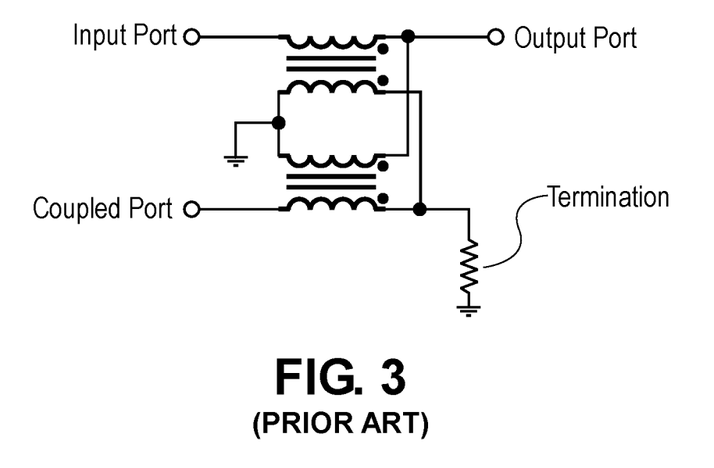
FIG. 3 is an illustration of a practical RF directional coupler having a terminated reverse-coupled port as known in the prior art.

While some implementations make use of both the forward-coupled port and the reverse-coupled port of a practical RF directional coupler, in many contexts the use of the reverse-coupled port is not required, and for this reason the reverse-coupled port is typically terminated. FIG. 3 is an illustration of a practical RF directional coupler having a terminated reverse-coupled port as is known in the prior art. A RF directional coupler in which both its coupled ports are in use may be called a RF bi-directional coupler.

The amount of signal power coupling from the input port to the coupled port is an attribute of a RF directional coupler. This attribute is typically expressed in dB and is a defining attribute of the RF directional coupler itself. For example, in an X dB RF directional coupler, the signal power at the coupled port equals X dB less than the signal power applied to the input port. Note that higher coupling means a lower value coupler (in other words, the value of X is lower).

Figure 4:
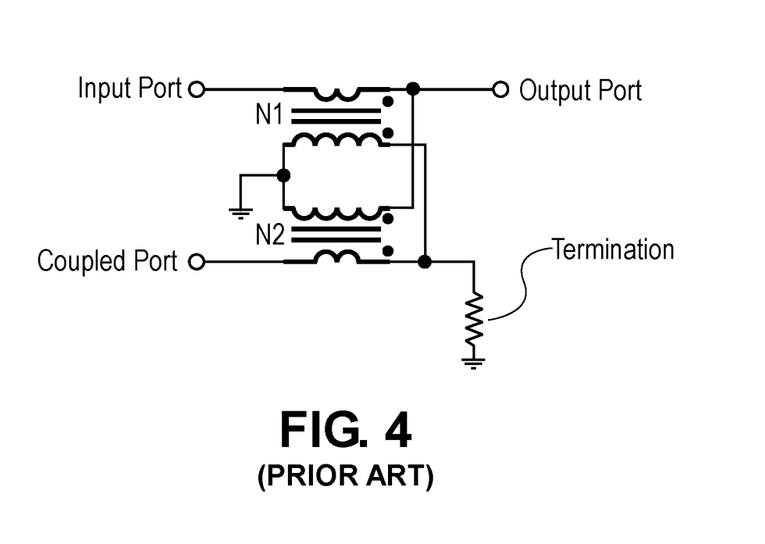
FIG. 4 is an illustration of a two-transformer based RF directional coupler as known in the prior art.

The amount of the signal power coupling is determined by internal properties of the RF directional coupler. To illustrate, consider FIG. 4, which is an illustration of a two-transformer based RF directional coupler as known in the prior art. The coupling value of the two-transformer based coupler of FIG. 4 is determined by the wire winding ratio between the primary and secondary sides of the two transformers labeled N1 and N2 in FIG. 4.

The main line loss (i.e., the loss across the input port to the output port or vice-versa) of a RF directional coupler is also typically expressed in dB, where Y dB main line loss means that the signal power transferred to the output port equals Y dB less than the signal power applied to the input port. For a theoretical RF directional coupler, increasing the amount of coupling increases the amount of main line loss; however, for a practical RF directional coupler, the amount of increase in main line loss due to an increase in couple is even more so. In defining the requirements of a practical RF directional coupler used in a communication device, a compromise exists between the required amount of coupling and the amount of main line loss that can be endured. A common design goal in a RF directional coupler is to minimize the main line loss while achieving the required amount of coupling.

The magnitude of the coupling typically hardly varies over the operational frequency band of a directional coupler. Moreover, coupling variation is typically undesired and is experienced due to non-ideal implementation limitations.

Figure 5:
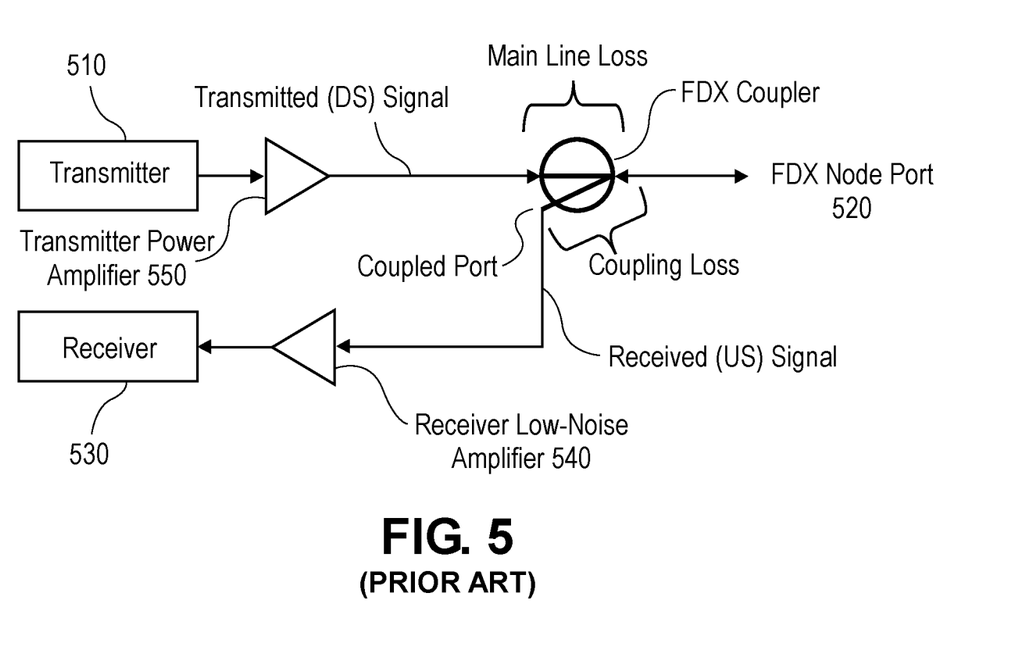
FIG. 5 is an illustration of a RF directional coupler in a Full Duplex DOCSIS (FDX) system implemented in an FDX node as known in the prior art.

In some unique applications, the practical RF directional coupler compromise between the required amount of coupling and the amount of main line loss has strong implications on the performance of a communication device utilizing the RF directional coupler. One such example is the use of a RF directional coupler in a Full Duplex DOCSIS (FDX) system as implemented in an FDX node, which is illustrated in FIG. 5. CableLabs® of Louisville, Colorado has publicly issued a DOCSIS 4.0 family of specifications. These specifications describe how a full duplex node may be utilized to achieve bidirectional communication in a cable plant utilizing a certain band of frequency concurrently for upstream and downstream communication from (and to) a FDX node to (and from) one or more FDX cable modems. Simultaneously, other bands of frequencies are utilized for one directional communication between the same devices. The FDX coupler shown in FIG. 5 is used to both direct the transmitted downstream (DS) signal from the FDX node transmitter 510 to the FDX node port 520, as well as to direct the intended received upstream (US) signal from the FDX node port 520 to the FDX receiver 530. The FDX coupler shown in FIG. 5 is further required to exhibit high directivity, thereby severely limiting the amount of undesirable transmit signal power that is coupled into the receiver amplifier 540.

The FDX node of FIG. 5 must deliver a high transmit signal power to FDX node port 520. As the FDX node of FIG. 5 exhibits high coupler main line loss, higher signal power must be produced by transmitter power amplifier 550. As a result, higher power consumption is required at transmitter power amplifier 550, thereby increasing the total power consumption of the FDX node.

At the same time, the FDX node must be able to receive a low power US signal from FDX node port 520. A higher coupling loss at the FDX coupler results in a lower signal-to-noise ratio (SNR) at FDX node receiver 530, which may reduce the communication channel throughput and/or increase the communication channel's error rate. A typical FDX node implementation may use a 6 dB FDX coupler that introduces 6 dB loss in the receive path. Such as coupler typically experiences a 2.5 dB main line loss and introduces a 2.5 dB loss in the transmit path. An alternative FDX node implementation may use a 10 dB FDX coupler, which introduces a 4 dB more loss in the receive path but experiences a lower main line loss and introduces only a 1.5 dB loss in the transmit path.

Other prior art implementations of a RF directional coupler (e.g., a strip-line coupler) may use different coupling mechanisms and/or constructions, but those prior art implementations present similar compromises between coupling and main line loss.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for a directional coupler having coupling variability at separate portions of an operational frequency band are presented herein. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

Embodiments of the invention may be used for a RF directional coupler that exhibits coupling variability at separate portions of the frequency band(s) utilized by a communication device (hereinafter referred to as an operational frequency band). Approaches discussed herein deliberately cause large coupling variability at different parts of the operational frequency band of a directional coupler to introduce more coupling at frequencies where such higher coupling is required and higher main line loss is tolerable, and lower coupling at frequencies where such lower coupling is tolerable and lower main line loss is desirable. The RF directional coupler of an embodiment may be a component of a Full Duplex (FDX) amplifier or a communications device, such as a FDX node.

Figures 6, 7:
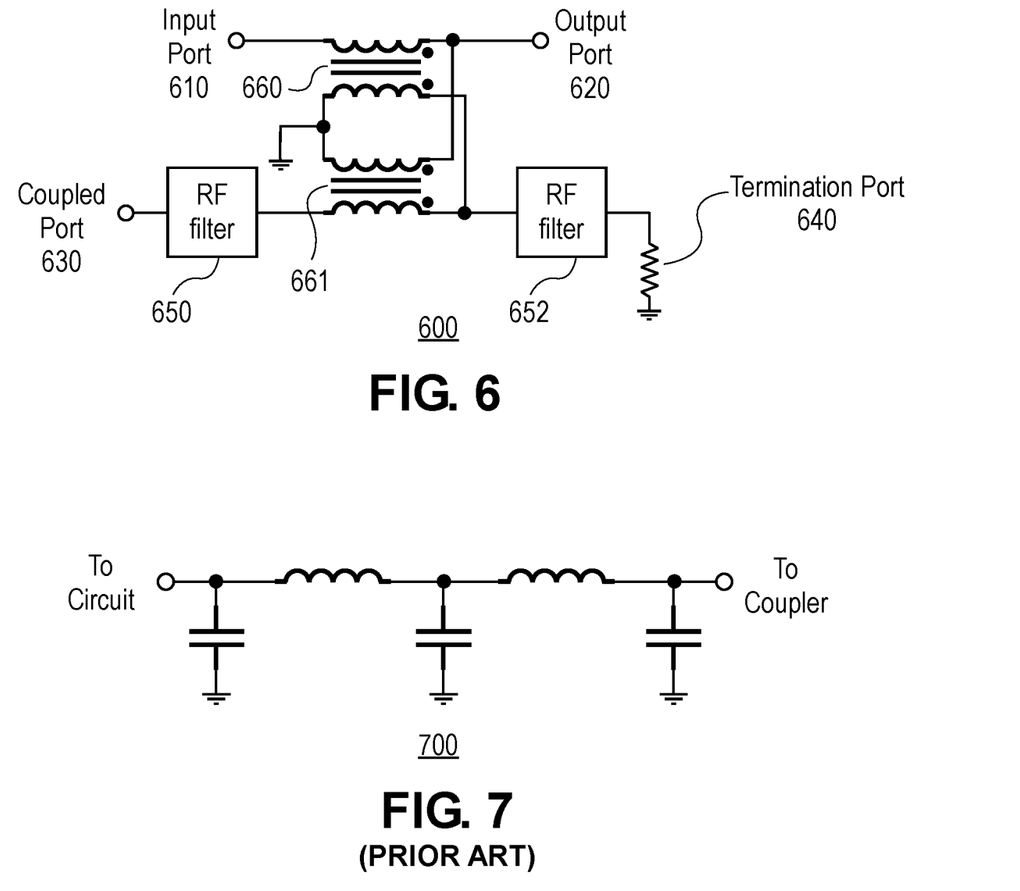
FIG. 6 is an illustration of a frequency selective coupler in accordance with an embodiment of the invention.
FIG. 7 is an illustration of a 5-element low pass filter (LPF) as known in the prior art.

FIG. 6 is an illustration of a frequency selective coupler 600 in accordance with an embodiment of the invention. Frequency selective coupler 600 comprises an input port 610, output port 620, a coupled port 630, and a termination port 640. Base transformers 660 and 661 are implemented to possess appropriate coupling to produce the high coupling desired in the high-coupling frequency band(s) of frequency selective coupler 600. RF filter 650 is added at coupled port 630 as shown and RF filter 652 is added at termination port 640. RF filters 650 and 652 are designed to pass the frequency band(s) of interest where high coupling is desired and high main line loss is tolerable.

Frequency selective RF filters 650 and 652 reflect signal power in the frequency band(s) where low coupling is tolerable and low main line loss is desired. The filter reflection is designed as high impedance relative to the characteristic impedance (e.g., 50 or 75 Ohm) exhibited at coupler port 630 and termination port 640.

Figure 8:
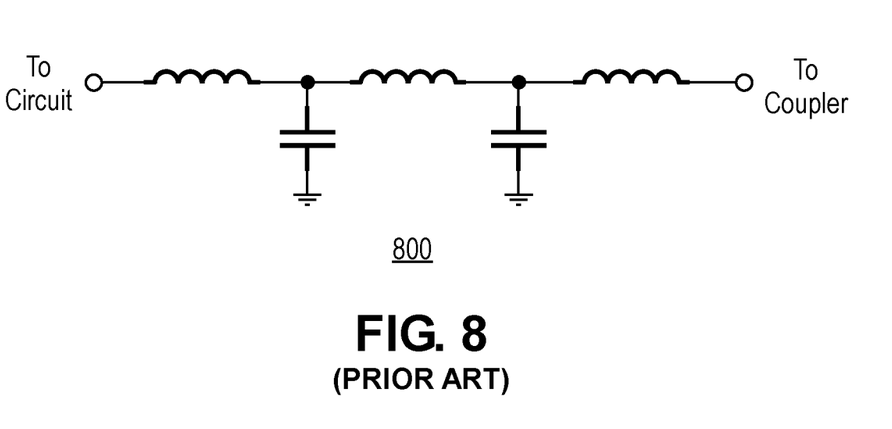
FIG. 8 is an illustration of a 5-element low pass filter (LPF) employing a series inductor as first element connected to the coupler as known in the prior art.

For example, a typical low pass filter (LPF) is designed with an odd number of elements and with parallel capacitors as first and last components. FIG. 7 illustrates an example of a 5-element low pass filter (LPF) 700 usable by an embodiment of the invention. Since capacitors are typically less costly than inductors, LPF 700 depicted in FIG. 7 is a less expensive implementing mechanism for RF filter 650 and 652 than an alternative design that employs inductors arranged in series as first and last elements, such as the 5-element low pass filter (LPF) 800 illustrated in FIG. 8. However, while both LPF filter 700 and LPF filter 800 are reflective at their frequency stop band, LPF filter 700 exhibits low impedance in that band and should not be used in a frequency selective coupler 600, while LPF filter 800 exhibits high impedance at the stop band, and may be used in the implementation of a frequency selective coupler 600.

Figure 9:
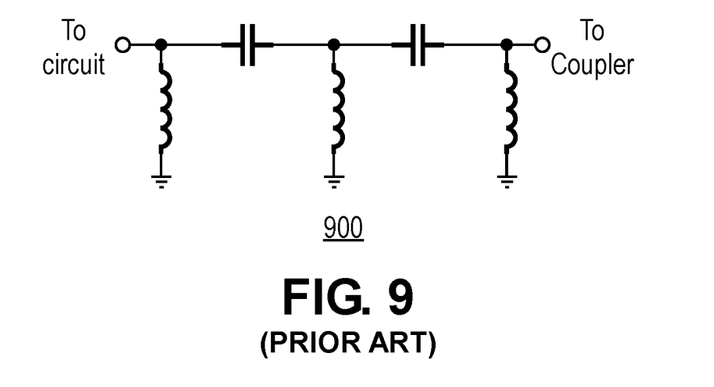
FIG. 9 is an illustration of a 5-element high pass filter (HPF) as known in the prior art.
Figure 10:
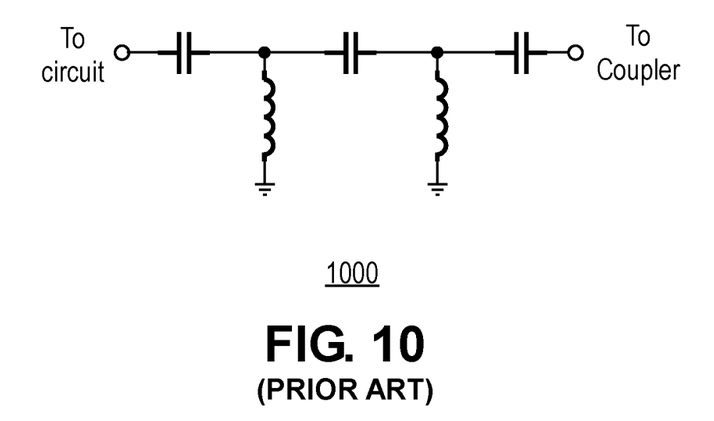
FIG. 10 is an illustration of a 5-element high pass filter (HPF) employing a series capacitor as first element connected to the coupler as known in the prior art.

As another example, a typical high pass filter (HPF) is designed with an odd number of elements and with series capacitors as first and last components. FIG. 9 illustrates an example of a 5-element high pass filter (HPF) 900 usable by an embodiment of the invention. Since capacitors are typically less costly than inductors, HPF 900 depicted in FIG. 9 is a less expensive implementing mechanism for RF filter 650 and 652 than an alternative design that employs inductors arranged in parallel as first and last elements, such as the 5-element high pass filter (HPF) 1000 illustrated by FIG. 10. Moreover, while both HPF filter 900 and HPF filter 1000 are reflective at their frequency stop band, HPF filter 900 exhibits low impedance in that band and should not be used in a frequency selective coupler 600, while HPF filter 1000 exhibits high impedance at the stop band, and may be used in the implementation of a frequency selective coupler 600.

At frequencies where RF filters 650 and 652 have a higher impedance than nominal, coupling mechanism 660 conveys (a) a higher effective impedance parallel to input port 610 and/or output port 620, and (b) a lower effective impedance in series between input port 610 and output port 620. As a result, the effective main line loss of frequency selective coupler 600 is lowered below its nominal value set by base transformers 660 and 661.

The non-flat main-line loss of frequency selective coupler 600, although beneficial by reducing main line loss at frequency band(s) where such is important, is typically considered an undesirable effect in a communication device in which a flat overall frequency response is desirable. However, this non flat main line loss may be compensated for by other parts of the communication device in which frequency selective coupler 600 is deployed. For example, in an embodiment, a Full Duplex (FDX) amplifier or a communication device, such as an FDX node, employing frequency selective coupler 600 may use frequency dependent amplitude compensation in its digital transmitter portion. The amount of compensation required to be performed by the communication device as a function of frequency can be determined using various techniques, such as by design modeling the frequency dependent coupler main line loss in the communication device, estimating the average frequency dependent main line loss by measuring a sample of communication devices, individual calibration of each communication device unit during its manufacturing process, and other suitable techniques.

Some technical contexts may utilize frequency selective coupler 600 to tap some of broadband signal power when only a relatively narrow part of the signal spectrum is of interest at coupled port 630. An example of such a use case is when the signal is composed of a multitude of channels, but only a single channel of that signal is required for a specific application. Nevertheless, utilizing a flat-spectrum frequency-nonselective coupler in such a case typically introduces undesirable coupler main line loss to the complete spectrum.

Figure 11:
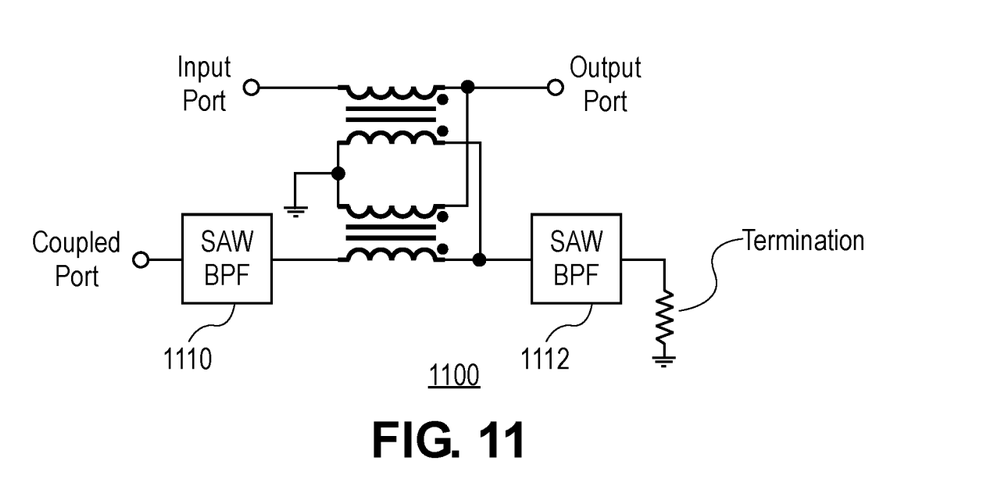
FIG. 11 is an illustration of a frequency selective coupler designed to provide the desired coupling for certain channel(s) of interest while minimizing main line loss for other channels in accordance with an embodiment.

FIG. 11 is an illustration of a frequency selective coupler 1100 designed to provide the desired coupling for certain channel(s) of interest while minimizing main line loss for other channels in accordance with an embodiment. RF filters 1110 and 1112 may be implemented using surface acoustic waves (SAW) band pass filters (BPF), which are known to produce excellent frequency selectivity and can be designed to pass a single dedicated channel. SAW BPF 1110 and 1112 are designed to reflect the signal power of other channels that are not of interest with high impedance. Thus, at stop-band frequencies where SAW BPF 1110 and 1112 have higher impedance than nominal, signals applied to frequency selective coupler 1100 experience a reduced main line loss through frequency selective coupler 1100.

Figure 12:
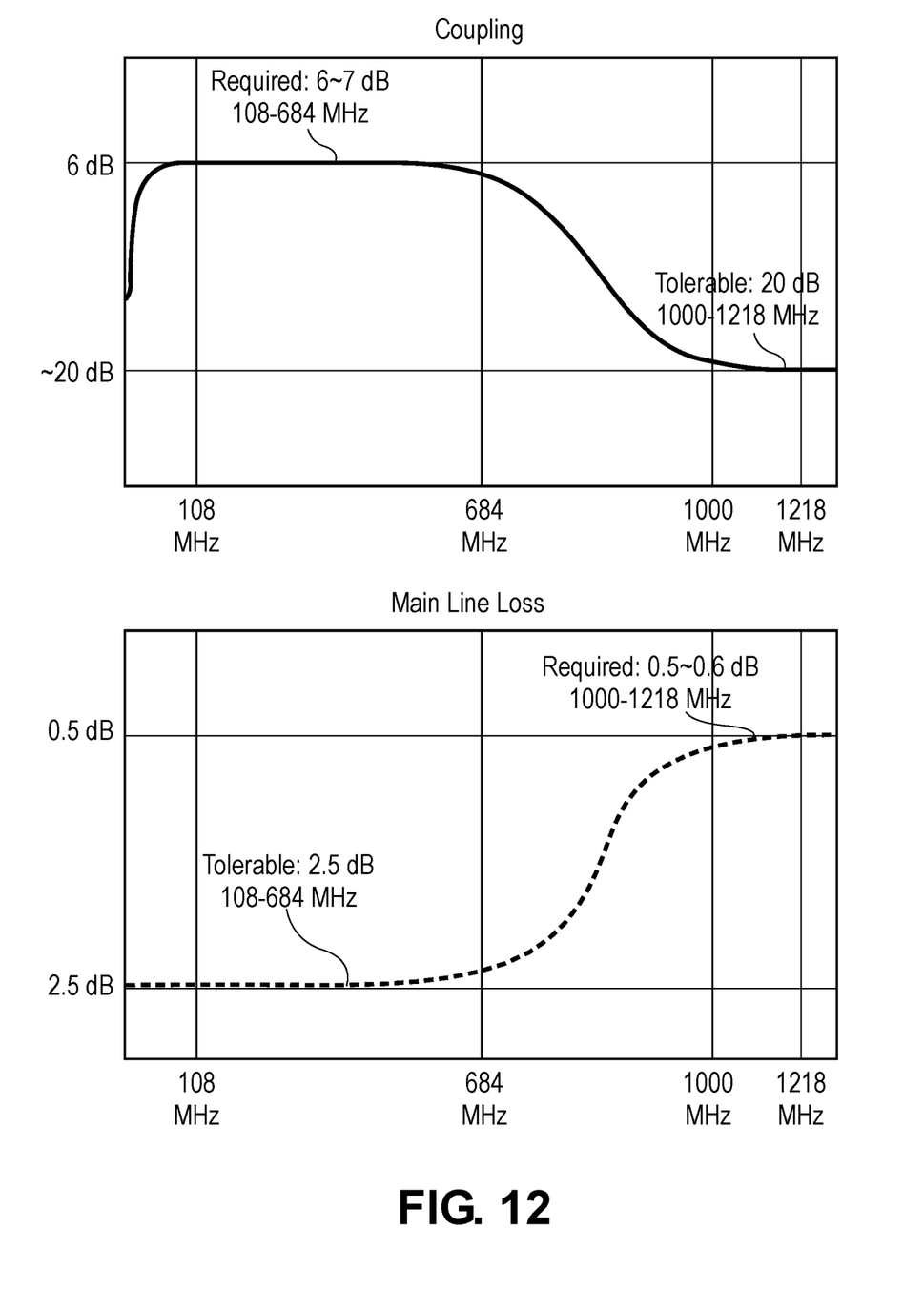
FIG. 12 is a set of graphs which illustrate an example of two conflicting FDX coupler requirements observed by an embodiment of the invention.

In certain embodiments, a frequency selective coupler is desirable to satisfy two conflicting requirements, namely high coupling at the CableLabs-specified FDX frequency band (108-684 MHz) to minimize upstream (US) receive signal loss and optimize US receiver performance, and a low main line loss at high downstream (DS) frequency, e.g., 1000~1218 MHz. FIG. 12 is a set of graphs which illustrate these two conflicting FDX coupler requirements observed by an embodiment of the invention.

Figure 13:
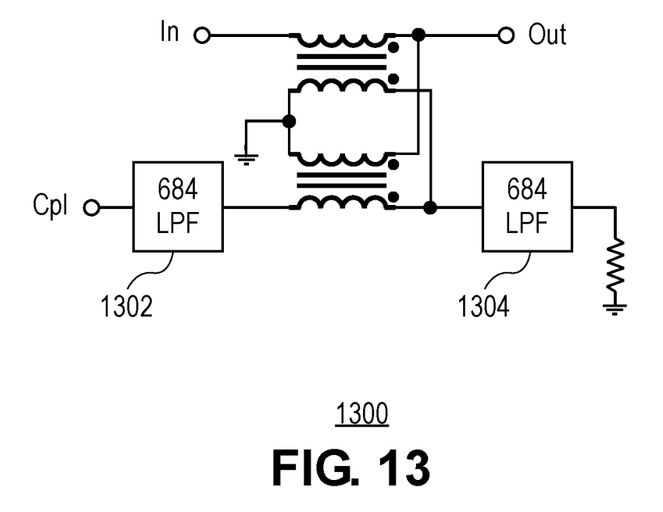
FIG. 13 is an illustration of a frequency selective coupler optimized for a FDX deployment in accordance with an embodiment of the invention.

An embodiment of the invention may utilize two 684 MHz LPF to create an FDX optimized coupler 1300 as shown in FIG. 13. Due to the high positive amplitude tilt as a function of frequency that is required at the output of the FDX node, most of the transmitted RF output power is at relatively higher frequency. For example, with a typically required 21 dB positive linear amplitude tilt between 108 MHz and 1218 MHz, the power of the RF signal in the top third of the transmitted RF spectrum is 6.3 dB higher than the RF signal power in the remaining two thirds of the output spectrum. The two 684 MHz LPF denoted 1302 and 1304 in FIG. 13 are designed with a reflective high impedance at the higher frequency band, thus while the overall coupling is lower at higher frequency, the coupler main line loss at higher frequency is reduced as desired.

Figure 14:
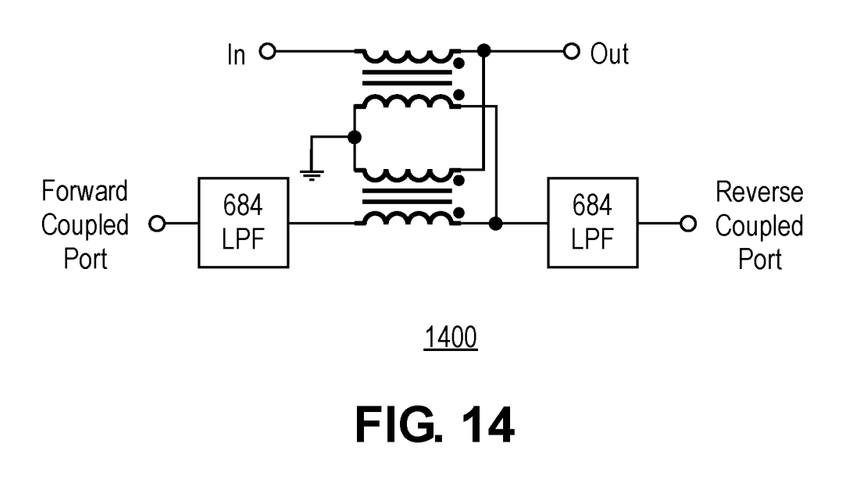
FIG. 14 is an illustration of a frequency selective bidirectional coupler optimized for FDX deployments in accordance with an embodiment of the invention.

In certain embodiments, a frequency selective bidirectional coupler is desirable to satisfy the same two conflicting requirements, namely high coupling in the frequency band(s) where such high coupling is required and high main line loss is tolerable, and low coupling in the frequency band(s) where such low coupling is tolerable and low main line loss is required. Such a frequency selective bidirectional coupler 1400 optimized for the CableLabs-specified FDX node is shown in FIG. 14. A desired low main line loss is achieved in the higher portion of the operational spectrum, while high bidirectional coupling is provided in the range of the spectrum below 684 MHz.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent modification. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A Full Duplex (FDX) amplifier, comprising:
a directional coupler, comprising:
an input port for a signal;
an output port for the signal;
a coupled port for the signal;
a termination port for the signal;
a first RF filter coupled to said coupled port; and
a second RF filter coupled to said termination port,
wherein said first RF filter and said second RF filter yield a first uniform coupling value for said directional coupler across a first contiguous range of frequencies of the operational frequency band of the directional coupler and a second uniform coupling value, different than said first uniform coupling value, for said directional coupler across a second contiguous range of frequencies of the operational frequency band,
wherein higher coupling for said directional coupler is desired and greater loss in said signal is tolerable at said first contiguous range of frequencies relative to said second contiguous range of frequencies,
wherein lower coupling for said directional coupler is desired and lower loss in said signal is tolerable at said second contiguous range of frequencies relative to said first contiguous range of frequencies, and
wherein the FDX amplifier comprises a digital transmitter capable of performing frequency dependent amplitude compensation to compensate for frequency-variable loss imposed on said signal by said directional coupler.

2. The FDX amplifier of claim 1, wherein said first RF filter and said second RF filter both present high impedance relative to the characteristic impedance of said directional coupler at said second contiguous range of frequencies of the operational frequency band.

3. The FDX amplifier of claim 1, wherein said first RF filter and said second RF filter are both surface acoustic wave (SAW) band pass filters.

4. The FDX amplifier of claim 1, wherein said first RF filter and said second RF filter are both designed to pass one or more channels contained in said signal.

5. The FDX amplifier of claim 1, wherein said first RF filter and said second RF filter are both low pass filters (LPF) designed to pass the Full Duplex band of DOCSIS 4.0 and block higher frequencies.

6. A method for using a RF coupler having coupling variability at separate portions of an operational frequency band, comprising:
using the RF coupler, comprised within a Full Duplex (FDX) amplifier, to provide coupling variability at separate portions of an operational frequency band,
wherein the RF coupler comprises:
an input port for a signal;
an output port for the signal;
a forward coupled port for the signal;
a reverse coupled port for the signal;
a first RF filter coupled to said coupled port; and
a second RF filter coupled to said reverse coupled port,
wherein said first RF filter and said second RF filter yield a first uniform coupling value for said RF coupler across a first contiguous range of frequencies of the operational frequency band of the RF coupler and a second uniform coupling value, different than said first uniform coupling value, for said RF coupler across a second contiguous range of frequencies of the operational frequency band,
wherein higher coupling for said directional coupler is desired and greater loss in said signal is tolerable at said first contiguous range of frequencies relative to said second contiguous range of frequencies, and
wherein lower coupling for said directional coupler is desired and lower loss in said signal is tolerable at said second contiguous range of frequencies relative to said first contiguous range of frequencies.

7. The method of claim 6, wherein said first RF filter and said second RF filter are both low pass filters (LPF) designed to pass the Full Duplex band of DOCSIS 4.0 and block higher frequencies.

8. The method of claim 6, wherein said reverse coupled port is coupled to ground and said RF coupler is a directional coupler.

9. The method of claim 6, wherein said RF coupler is a bidirectional coupler.

10. The method of claim 6, wherein said first RF filter and said second RF filter both present high impedance relative to the characteristic impedance of said directional coupler at said second contiguous range of frequencies of the operational frequency band.

11. The method of claim 6, wherein said first RF filter and said second RF filter are both surface acoustic wave (SAW) band pass filters.

12. The method of claim 6, wherein said first RF filter and said second RF filter are both designed to pass one or more channels contained in said signal.

13. The method of claim 6, further comprising:
a digital transmitter, comprised within the FDX amplifier, performing frequency dependent amplitude compensation to compensate for frequency-variable loss imposed on said signal by said RF coupler.

* * * * *